United States Patent [19]

Kotaka

[11] 3,795,884

[45] Mar. 5, 1974

[54] ELECTRICAL CONNECTOR FORMED FROM COIL SPRING

[75] Inventor: Yasumasa Kotaka, Kawasaki, Japan

[73] Assignee: AMP Incorporated, Harrisburg, Pa.

[22] Filed: Mar. 6, 1973

[21] Appl. No.: 338,492

[52] U.S. Cl. .............. 339/17 LM, 317/101, 339/59, 29/629

[51] Int. Cl. .............................................. H05k 1/12

[58] Field of Search ....... 339/17, 18, 59, 19, 67, 95, 339/154, 156, 174, 182, 183, 199 C, 246, 249, 252, 270, 271, 263; 335/207; 338/303, 311; 317/101; 29/625, 629

[56] References Cited

UNITED STATES PATENTS 2,662,148 12/1953 Stibitz ............................ 338/311 X
3,638,163 1/1972 Loosme............................ 339/17 C
3,173,732 3/1965 James ........................... 339/17 LM

FOREIGN PATENTS OR APPLICATIONS 2,129,553 10/1972 France ................................ 339/17

*Primary Examiner*—Marvin A. Champion
*Assistant Examiner*—Terrell P. Lewis
*Attorney, Agent, or Firm*—William J. Keating

[57] ABSTRACT

Connector for connecting conductors on printed circuit board comprises insulating block having coil spring encapsulated therein. The block has an axial cut extending through the spring to separate the individual turns. The turns are exposed on the upper and lower sides and PC boards are clamped against these sides. The turns serve as conductors extending between the terminal pads on the PC boards.

7 Claims, 8 Drawing Figures

ELECTRICAL CONNECTOR FORMED FROM COIL SPRING

BACKGROUND OF THE INVENTION

The instant invention is directed to the achievement of an improved connector for electrically connecting the terminal pads of PC boards located adjacent to each other.

The continuing trend towards the use of smaller electronic circuit devices gives rise to a need for smaller and smaller connecting devices and mounting means for the circuit devices. The circuit devices, such as integrated circuits of a complex nature can be mounted on ceramic substrates or printed circuit boards and the terminal areas of the devices connected to conductors on the boards. The conductors on the boards can be made extremely fine by the known manufacturing methods involving photoetching but the formation of disengageable connections to these fine conductors presents difficult problems if conventional stamped and formed terminals or connecting devices are used. There is a lower limit to the size of sheet metal stamped and formed contact devices which is dictated by the nature of the stamping and forming manufacturing process.

In accordance with one embodiment of the present invention, a connector for connecting the conductors of two circuit boards or the like, is formed from a continuous winding of fine wire. The winding is encapsulated in plastic and a segment of each turn is removed so that a plurality of electrically separate and aligned conductors remain. These conductors are exposed on two faces of the connector and the PC boards are clamped against these faces. The individual conductors serve as continuous paths between corresponding conductors on the PC boards.

It is accordingly an object of the invention to provide an improved electrical connector. A further object is to provide a connector having conducting elements therein on closely spaced centers. A further object is to provide an efficient and inexpensive manufacturing process for the production of connecting devices.

These and other objects of the invention are achieved in preferred embodiments of the invention which are briefly described in the foregoing abstract, which are described in detail below, and which are shown in the accompanying drawings in which.

Figure 1:
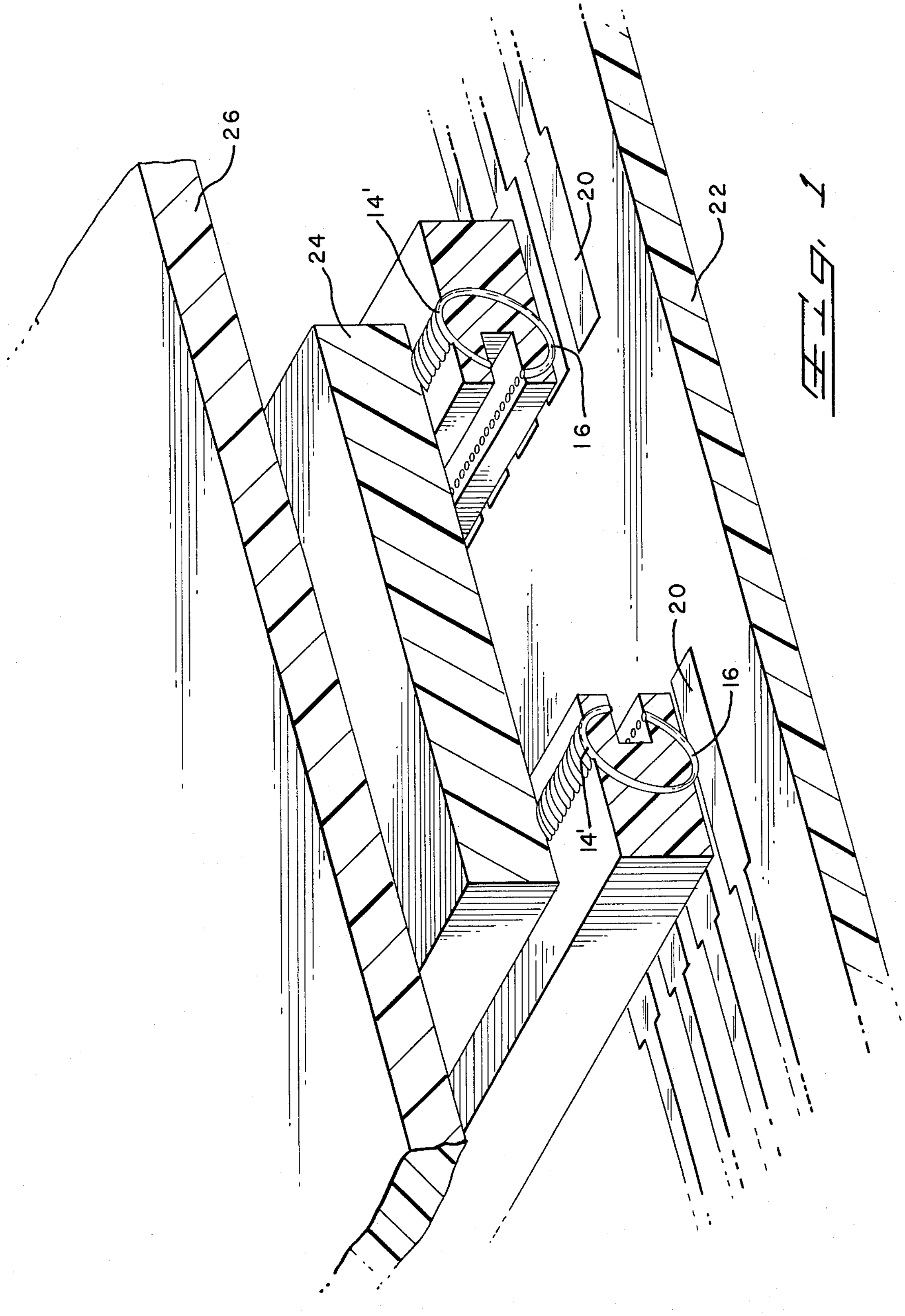
FIG. 1 is a fragmentary perspective view of a printed circuit mother board and a ceramic substrate, the conducting pads on the substrate being connected to conducting pads on the mother board by connectors in accordance with the invention.
Figure 2:
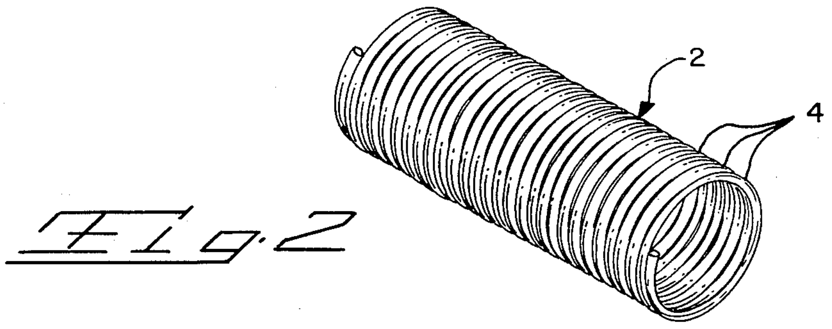
FIGS. 2–5 are views which illustrate the manufacture of a connector in accordance with the invention.

The principles of the invention can best be described with reference to FIGS. 2–5 which illustrate the production of a connector in accordance with the invention by one preferred method. In accordance with this method, a coil spring 2 is wound of a conductive metal and has individual turns 4 which are located relatively close to each other. The coil is then encapsulated by molding a plastic insulating material 6 therearound. An element 8 of the molding is then removed from one side thereof and a short segment of each turn is also removed during this step which may be carried out by a milling operation or by grinding. Any metal chips which remain in the trough produced are removed so that the individual turns 4 are electrically separated from each other. The upper and lower sides or faces 12, 14 are then shaved or material is removed from these faces in any other suitable manner so that portions 14', 16 of each turn are exposed.

Referring now to FIG. 1, when it is desired to connect terminal areas 20 on one printed circuit board 22 to terminal areas (not shown) on the underside of another PC board 24 or similar device, connectors 18 in accordance with the invention are located on the upper side of the board 22 with one or more of the exposed areas 16 against each terminal pad 20. The circuit board 24 is then positioned on the upper sides of the connectors with the terminal areas against one or more of the exposed contact areas 14'. A clamping pressure is then applied as by a clamping plate 26 so that the exposed contact areas 14', 16 will be snugly against the terminal pads.

A wide variety of materials can be used in the practice of the invention and connectors in accordance with the invention can be made in any desired size although it is a distinct advantage that close spacing can be easily achieved. The wires can be of uninsulated spring metal such as berillum copper so that they will serve as springs in the connecting system shown in FIG. 1. Alternatively, the wires can be of pure copper which is not generally considered a spring material and the material of the molding can be relied upon to impart spring characteristics to the connector. For example, the plastic can be a polyurethane suitable composition which has excellent spring characteristics although other elastomers can be used if good high temperature performance is required. The plastic can be a relatively hard one if desired and/or the spring system can depend upon both the plastic and the spring characteristics of the individual contact members 4.

Figure 3:
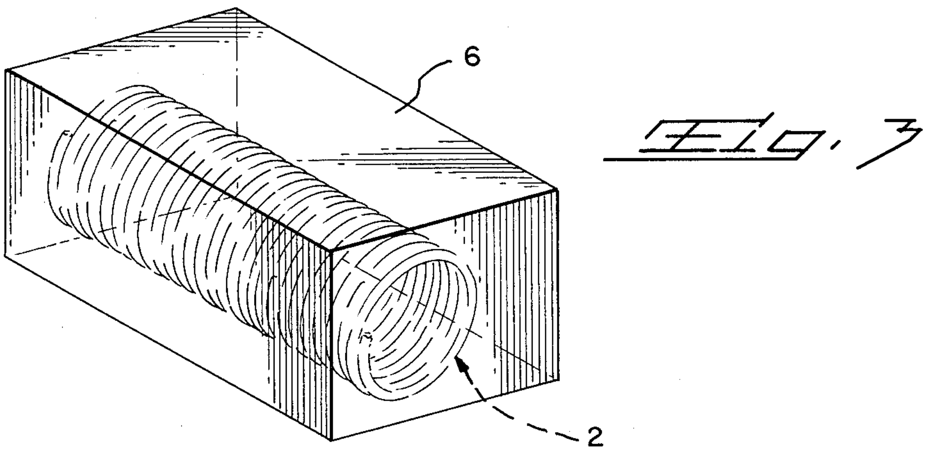
Figure 4:
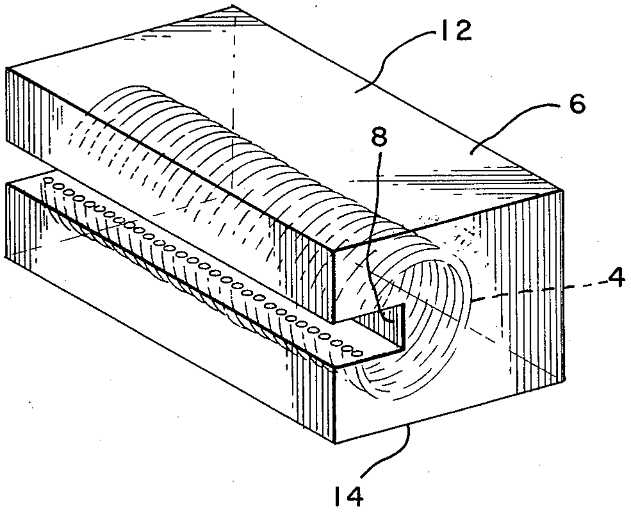
Figure 5:
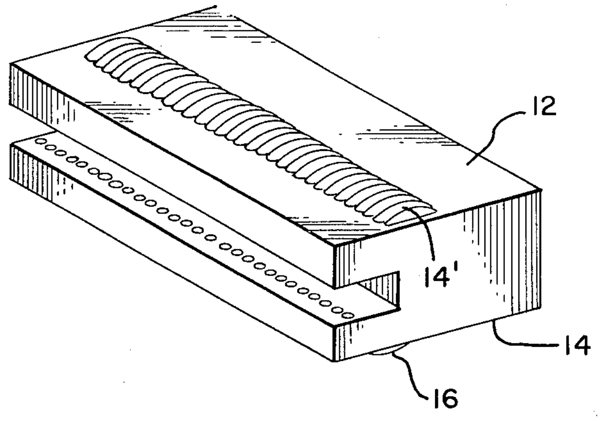

As noted above, the invention permits the achievement of connectors having contact members 4 which are very close to each other. If close spacing is a requirement, the wires can be insulated with a varnish-type insulation, (polyvinyl formal resin) or an extremely thin insulating sheath which will bond to the plastic material which is molded around the spring as shown in FIG. 3. For example, the wires may have a one mil diameter and a one-half mil coating of insulation and can be wound so that the center to center spacing between adjacent contact areas 14'and 16 is two mils. As noted above, connectors can be made in larger sizes if desired in order to benefit from the ease of manufacturing.

The contact areas 14', 16 can be electroplated with any suitable metal such as tin or gold. Electroplating can be carried out by an electroless process or a single electrode can be inserted into the trough 8 so that it will engage all of the ends of the contact members 4 if an electrolytic plating process is used.

The trough 8 can be filled if desired with an insulating bar to prevent foreign matter from lodging therein and if desired, this bar can have spring properties in its own right which complement the spring properties of the block 18 and/or the contact elements 4. The use of an insulating member in this trough will also prevent shorting between adjacent contact elements.

While FIGS. 1–5 show a connector having uniform spacing of the contact elements, variable spacing can be achieved by simply winding a spring or coil having the desired combination of spacings between contact elements 4. A connector can thus be tailor made for a particular circuit pattern or terminal pad arrangement on the circuit boards 22, 24.

Figure 6:
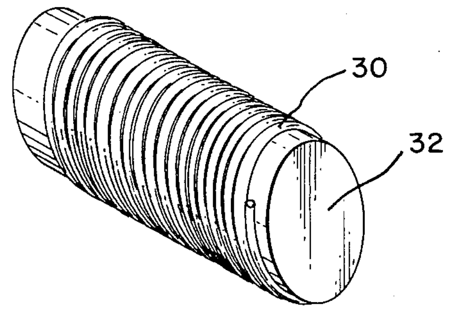
FIGS. 6 and 7 illustrate an alternative connector and manufacturing method in accordance with the invention.
Figures 7, 8:
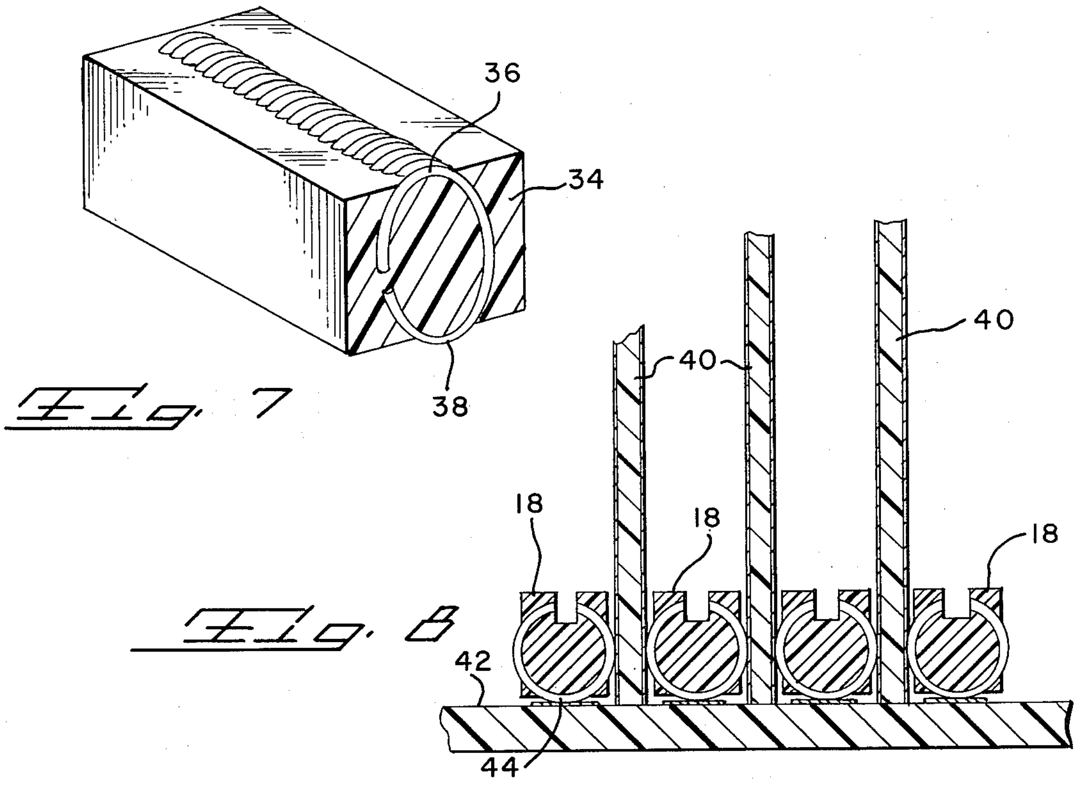
FIG. 8 is an end view illustrating another method of mounting printed circuit boards or substrates on a mother board and forming connections between the boards in accordance with the invention.

FIGS. 6 and 7 illustrate an alternative manufacturing method in accordance with the invention in which the conductor 30 is wound on an insulating member 32 having a generally oval-shaped cross-section. A segment of each turn is removed as described above and insulating material 34 is applied over the conductor 30 excepting at the contact areas 36, 38. Again, the conductor may be insulated and the coating 34 need not necessarily be applied. The original coil can, of course, be wound in other shapes which may give best results for a particular application of the invention. The oval-shaped contact members 31 of FIG. 7 will have improved strength or spring characteristics as compared to a circular contact member.

FIG. 8 shows one of the many alternative methods of connecting parallel circuit boards 40 on a panel or mother board 42. In this embodiment, the connectors 18 are positioned on the panel 42 and between the circuit boards 40. Under some circumstances, it may prove desirable to connect conductors on the boards 40 to conductors on the panel 42 by exposing the web of eace contact element so that it can engage a conductor on the board 42 at 44.

A salient advantage of the invention is the ease with which a connector can be manufactured. This advantage is particularly significant where the adjacent turns are extremely close to each other, the wire is extremely fine wire, and the connector is to be used for an extremely small electrical circuit. A connector formed of fine wire can be used with panel boards having extremely fine conductors thereon at closely spaced intervals or with panel boards having coarse conductors so that several contact members in the connector engage each terminal pad on the panel board for redundant contacts. A spring system of the type herein disclosed can be engineered to develop a fully adequate contact force each contact member even if extremely fine wire is used and is wound on a relatively small diameter for the coil.

Changes in construction will occur to those skilled in the art and various apparently different modifications and embodiments may be made without departing from the scope of the invention. The matter set forth in the foregoing description and accompanying drawings is offered by way of illustration only.

What is claimed is:

1. A multi-contact electrical connector for connecting conductors as two panel-like members which are adjacent to each other, said connector comprising:

a body of insulating material having two oppositely directed faces, said faces constituting contact faces, a plurality of side-by-side contact members supported in said body, each of said members comprising a section of wire having an intermediate portion which extends arcuately between said contact faces, each of said contact members having arcuate contact portions which extend beyond said faces, a recess on one side of said body which is between said faces, said contact members having end portions which extend from said faces through said body and to the sides of said recess, said contact members having originally been a continuous generally helical member, said recess having been formed by removal of a portion of said body and removal of segments of each turn of said helical member.

2. A multi-contact electrical connector as set forth in claim 1, said body of insulating material being an elastomer.

3. A multi-contact electrical connector as set forth in claim 1, said contact members being of a resilient conductive metal, said contact members being spring members.

4. A multi-contact electrical connector as set forth in claim 1, said body of insulating material being an elastomer, said contact member being of soft copper.

5. A method of making a multi-contact electrical connector comprising the steps of:

winding a continuous coil of a conductive wire, encapsulating said coil in a block of insulating material, removing a longitudinal element of said block from one side thereof which element contains a segment of each turn of said coil thereby to electrically separate adjacent turns of said coil, and removing portions of two sides of said block which adjoin said one side thereby to expose portions of each of said turns on said two sides, said exposed portions serving as contact areas for conductors on panel-like members located against said two sides.

6. The method set forth in claim 5 including the step of plating said exposed areas with a conductive metal.

7. The method set forth in claim 5 wherein said coil is encapsulated in an insulating material which is elastomeric.

* * * * *